United States Patent
Lynch

(10) Patent No.: US 7,706,144 B2
(45) Date of Patent: Apr. 27, 2010

(54) HEAT DISSIPATION SYSTEM AND RELATED METHOD

(76) Inventor: Thomas W. Lynch, 715 Holiday Dr., #8, Galveston, TX (US) 77550

( * ) Notice: Subject to any disclaimer, the term of this patent is extended or adjusted under 35 U.S.C. 154(b) by 161 days.

(21) Appl. No.: 11/958,066

(22) Filed: Dec. 17, 2007

(65) Prior Publication Data

US 2009/0154106 A1     Jun. 18, 2009

(51) Int. Cl.
*H05K 7/20* (2006.01)
(52) U.S. Cl. .............. 361/704; 361/710; 361/717; 361/719; 165/80.3; 165/185; 257/719; 174/16.3
(58) Field of Classification Search .......... 361/679.47, 361/702–712, 714, 715–724; 165/80.2, 80.3, 165/80.4, 80.5, 104.33, 185; 257/706–727, 257/736; 174/15.1, 15.2, 16.3, 252; 29/841, 29/842, 602.1, 854, 592.1, 832
See application file for complete search history.

(56) References Cited

U.S. PATENT DOCUMENTS

| 4,649,415 | A | | 3/1987 | Hebert | |
|---|---|---|---|---|---|
| 4,811,081 | A | | 3/1989 | Lyden | |
| 5,483,103 | A | * | 1/1996 | Blickhan et al. | 257/718 |
| 5,825,625 | A | * | 10/1998 | Esterberg et al. | 361/719 |
| 5,960,535 | A | * | 10/1999 | Rubens et al. | 29/832 |
| 5,990,550 | A | * | 11/1999 | Umezawa | 257/712 |
| 6,000,125 | A | * | 12/1999 | Kang | 29/832 |
| 6,215,180 | B1 | * | 4/2001 | Chen et al. | 257/720 |
| 6,219,243 | B1 | * | 4/2001 | Ma et al. | 361/704 |
| 6,345,507 | B1 | * | 2/2002 | Gillen | 62/3.7 |
| 6,490,161 | B1 | * | 12/2002 | Johnson | 361/704 |
| 6,580,611 | B1 | * | 6/2003 | Vandentop et al. | 361/704 |
| 2004/0173901 | A1 | * | 9/2004 | Mallik et al. | 257/738 |
| 2005/0245060 | A1 | | 11/2005 | Chiu | 438/612 |

FOREIGN PATENT DOCUMENTS

JP      411163232 A  *  6/1999
WO     2004/112129       12/2004

* cited by examiner

*Primary Examiner*—Michael V Datskovskiy
(74) *Attorney, Agent, or Firm*—Dorsey & Whitney LLP

(57) ABSTRACT

Embodiments described herein may include example embodiments of methods, apparatuses, devices, and/or systems for heat dissipation.

15 Claims, 6 Drawing Sheets

HEAT DISSIPATION SYSTEM AND RELATED METHOD

BACKGROUND

As the circuit density of microelectronic components increases, heat generated by these devices may typically increase as well. Microelectronic components may include, for example, microprocessors, such as central processing units (CPU), graphic processing units (GPU), digital signal processors (DSP); one or more memory devices; one or more application specific integrated circuits (ASIC); and/or other types of electronic components such as capacitors and/or resistors, as just a few examples. Microelectronic components may include an integrated circuit located within a bathtub recess in a package. Such integrated circuits may be thermally and mechanically coupled to the package on one side, such as by a gold eutectic compound, for example. The reverse side of the integrated circuit may be temporarily left open. Pads may be placed around the edge of the integrated circuit and tiny bonding wires may be attached from the pads to the package. After bonding is complete, a cap may typically be placed over the opening of the bath tub in order to protect the bonding wires.

Various techniques may typically be used to remove or dissipate heat generated by a microelectronic component. These techniques may include passive and/or active thermal solutions, for example. One such technique, which may be classified as a passive thermal solution, may involve the use of a thermally conductive device in thermal contact with a microelectronic component. This thermally conductive device may comprise a mass of thermally conductive material such as a slug or heat spreader, or may comprise a device configured to enhance convective heat transfer, such as a heat sink. However, techniques for heat dissipation and/or removal may not produce the desired results, and additional techniques and/or devices for dissipating and/or removing heat may be used.

For example, a heat sink may be bonded to an integrated circuit package. This may typically be done by a systems manufacturer who bought the packaged integrated circuit from an integrated circuit vendor. Though, the integrated circuit vendors may sell packaged integrated circuits with heat sinks already attached. The heat sink may be bolted or bonded to the package, and heat transfer compound may be placed on the integrated circuit and/or heat sink before the bonding in order to facilitate the thermal conductivity between the integrated circuit and the heat sink. Sometimes, the package body itself may be expected to radiate sufficient heat, and a separate heat sink may not be included. Typically, the heat flow through a heat sink may be a function of $f(T_{bonded}-T_{open})$ where $T_{open}$ is the temperature of open side of the heat sink, and $T_{bonded}$ is the temperature at the bonded side. As $T_{open}$ decreases, heat flow significantly increases, and thus $T_{bonded}$ may also decrease. For this reason some manufacturers may place fans directly on the heat sink to cause $T_{open}$, to drop near $T_{ambient}$, the ambient temperature of the assembly.

The whole assembly of a heat sink and an integrated circuit package may then be placed on a system board. By definition, the entity that places the assembly on the system board is the systems manufacturer. It is not unheard of for integrated circuit vendors to also be systems manufacturers. In some systems, there may be multiple integrated circuits on the board, with the possibility of daughter boards. One or more of the integrated circuits may have heat sinks. Once the assembly has been placed on the system board, the system board may then in turn be placed in an enclosure. The enclosure may trap heat, causing $T_{ambient}$ to rise, and then consequently causing $T_{open}$ to rise, and then $T_{bonded}$ to rise. If the $T_{bonded}$ rises too far, the integrated circuit may melt and be destroyed. In order to lower $T_{ambient}$ within the enclosure, some manufacturers may place fans on the enclosure. This may cause $T_{ambient}$ to drop towards $T_{room}$, the temperature in the room where the enclosed computer is being used.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
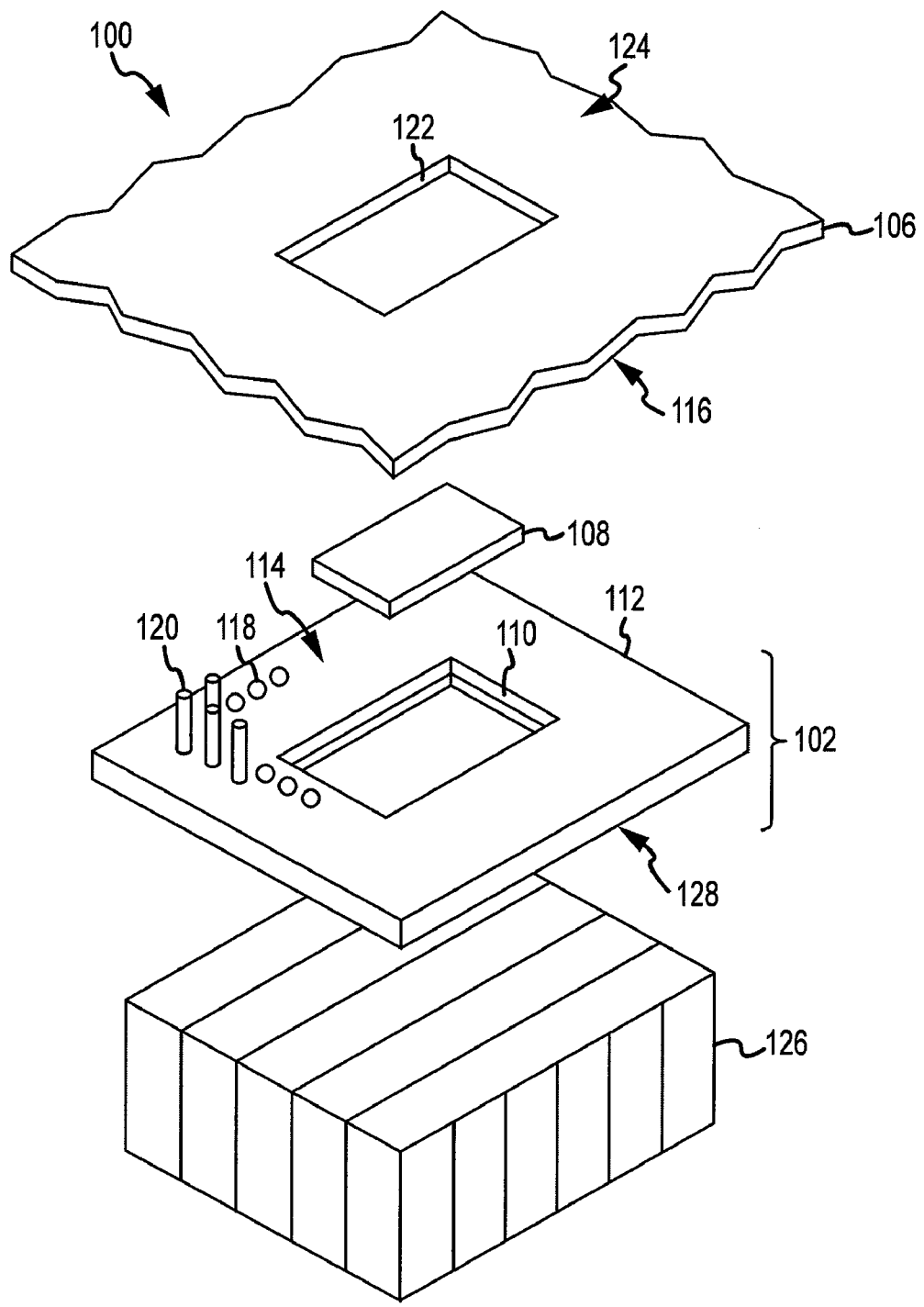
FIG. 1 is an exploded perspective view illustrating an electronic assembly in accordance with one or more embodiments.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the term "and/or" as referred to herein may mean "and", it may mean "or", it may mean "exclusive-or", it may mean "one", it may mean "some, but not all", it may mean "neither", and/or it may mean "both", although the scope of claimed subject matter is not limited in this respect.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

All electronic assembly may comprise one or more electronic components coupled to a substrate, and may additionally be referred to as an electronic package, for example. The substrate, in at least one embodiment, may comprise a printed circuit board (PCB), for example, and may be comprised of one or more layers, which may be laminated layers, for example, and may include conductive and/or non-conductive layers, and one or more layers may have one or more conductive features formed thereon, for example. In one embodiment, a PCB may comprise one or more layers of non-conductive material interleaved and/or laminated with one or more conductive circuit patterns and/or one or more additional layers, for example. Additionally, an electronic assembly or electronic package may comprise one or more microelectronic components, including, for example, integrated circuit (IC) components such as one or more microprocessors, graphics processing units (GPU), digital signal processors (DSP) and/or a central processing units (CPU), one or more memory devices, one or more application specific integrated circuits (ASIC), and/or may include other types of electronic components such as capacitors, resistors, and/or connectors including input/output (I/O) connectors for coupling to external circuitry, such as bus circuitry, for example, but it is important to note that claimed subject matter is not so limited. In at least one embodiment, one or more electronic assemblies may be coupled to form an electronic device. Examples of electronic devices may include, for example, computers, including desktop computers, laptop computers, servers, switches, and/or hubs, handheld devices, including digital cameras and cellular or wireless telephones, and may additionally include peripheral devices, including printers, monitors, and/or scanners, for example. Those skilled in the art will recognize, however, that particular embodiments are not limited in this respect, but may be applicable to any electronic assembly and/or electronic device that utilizes one or more microelectronic components, for example.

As alluded to previously, a microelectronic component may generate heat, and a thermal solution may be utilized to at least partially dissipate the generated heat, for example. A thermal solution may comprise one or more heat dissipation devices, and may generally be classified as active and/or passive thermal solutions. In this context, active thermal solutions may refer generally to heat dissipation devices wherein at least a portion of the heat dissipation device utilizes energy to at least partially dissipate heat, such as electrical energy, chemical energy, and/or fluid energy, for example. Although claimed subject matter is not so limited, one or more active thermal solutions may comprise fans, refrigeration components, and/or thermoelectric components, also referred to as Peltier devices, as just a few examples. Additionally, passive solutions may refer generally to heat dissipation devices wherein heat dissipation is performed primarily by one or more heat transfer modes, such as conduction and/or convection, and without the use of additional energy, for example.

Although claimed subject matter is not so limited, one or more passive thermal solutions may comprise heat spreaders, such as integrated heat spreaders (IHS), heat slugs, and/or heat sinks, such as finned or pinned heat sinks, but it is important to note that claimed subject matter is not limited to any particular thermal solution. Thermal solutions such as these may be comprised of one or more materials, which may be thermally conductive, for example, although claimed subject matter is not so limited. For example, one or more of the aforementioned devices may be comprised of aluminum, copper, such as electrolytically plated copper, copper alloy, ceramic, silicon, nickel, gold, and/or alloys thereof and/or a combination thereof, although, again, claimed subject matter is not so limited. Additionally, a thermal solution utilized for a particular microelectronic component may comprise a combination of one or more passive and active solutions, such as a heat sink with a fan, for example. But, again, claimed subject matter is not limited in this respect.

Referring now to FIG. 1, there is illustrated an exploded perspective view of an example electronic assembly, in accordance with at least one embodiment. An electronic assembly 100 may comprise one or more microelectronic components 102 coupled to a substrate 106. Substrate 106 may comprise a PCB, for example, and may be comprised of one or more conductive and/or nonconductive layers (not shown), which may be laminated, for example. In such an arrangement, substrate 106 may be made of phranelic material, fiber glass material, mylar tape, or the like. None of these materials is well suited for heat conduction; accordingly, a majority of the heat may be expected to radiate from microelectronic components 102, and not from substrate 106. Substrate 106 may be coupled to one or more microelectronic components 102, which may comprise one or more types of microelectronic components, as described previously. For example, microelectronic component 102 may comprise an integrated circuit 108, such as a CPU, for example, located within a hollow 110 (or bath-tub) of a package 112. Integrated circuit 108 may be thermally and/or mechanically coupled to package 112 on one side, such as by a gold eutectic compound, for example. Pads may be placed around the edge of the integrated circuit and bonding wires may be attached from the pads to package 112. After bonding is complete, the reverse side of integrated circuit 108 may be left open or may alternatively be sealed within package 112 via a cap (not shown) placed over the hollow 110 in order to protect bonding wires.

Microelectronic component 102 may comprise a front surface 114 coupled to a first surface 116 of substrate 106. For example, microelectronic component 102 may be coupled to substrate 106 by use of one or more ball grid arrays (BGA) 118, pins 120, and/or the like. For example, microelectronic component 102 may be coupled to substrate 106 by use of various techniques, such as, for example, pin grid array, ball grid array, ball grid array with pinned interposers and wire bonding, although, again, these are just examples, and claimed subject matter is not limited in this respect, and may be applicable to any microelectronic component and/or attachment method resulting in the formation of an electronic assembly comprising at least one microelectronic component capable of generating heat, for example.

An aperture 122 may pass from first surface 116 to a second surface 124 of substrate 106. Front surface 114 of microelectronic component 102 may be coupled to first surface 116 of substrate 106 so as to be located to cover aperture 122 of substrate 106. Heat dissipation from the front surface 114 of microelectronic component 102 may be facilitated by aperture 122 of substrate 106.

A heat dissipation device 126 may be coupled to a back surface 128 of one or more microelectronic components 102. Heat dissipation device 126 may comprise a heat sink, such as a finned heat sink, and may have a fan (not shown) coupled thereto, although, of course, this is just one configuration, and claimed subject matter is not limited in this respect. Additionally, heat dissipation device 126 may be coupled to one or more of the aforementioned components by use of one or more adhesive materials, and/or one or more mechanical fastener mechanisms such as clamps and/or pins (not shown), for example. It is important to note, however, that numerous configurations of a heat dissipation device as well as numerous methods of attachment exist, and claimed subject matter is not limited in this respect. Additionally, a thermally conductive material may be located between heat dissipation device 126 and the back surface 128 of the microelectronic component 102.

In operation, although claimed subject matter is not so limited, heat may be conducted from one or more microelectronic components 102 to the heat dissipation device 126, for example. For example, in one embodiment, heat that is generated by microelectronic components 102 may be at least partially transferred by conduction to heat dissipation device 126. Further, heat may be transferred from the heat dissipation device 126 to the surrounding air by convection, which may be assisted by use of a fan, for example. Similarly, heat generated by microelectronic components 102 may be at least partially transferred by convection facilitated by aperture 122 of substrate 106.

Figure 2:
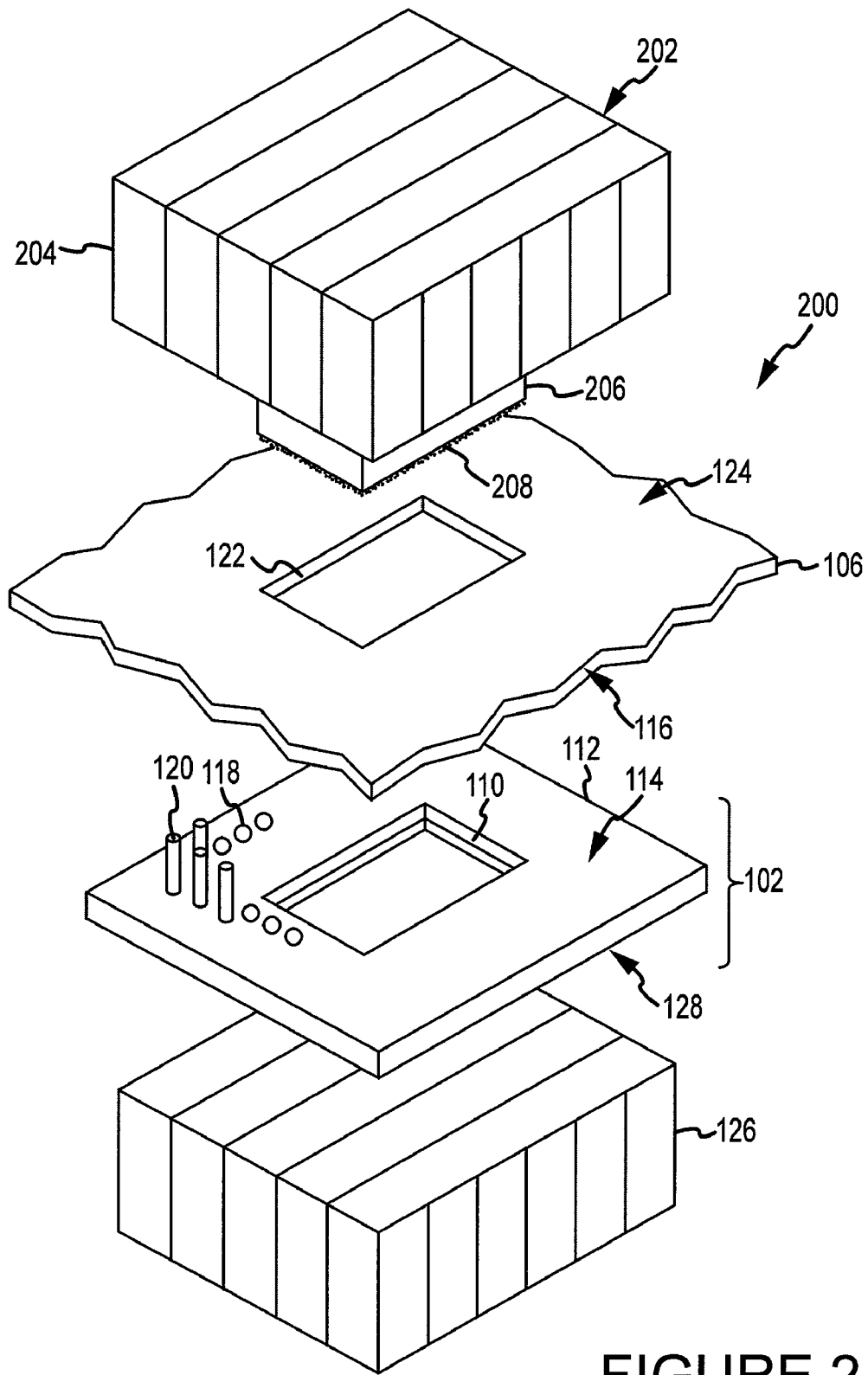
FIG. 2 is an exploded perspective view illustrating an electronic assembly in accordance with one or more embodiments.

Referring now to FIG. 2, there is illustrated an exploded perspective view of an example electronic assembly, in accordance with at least one embodiment. An electronic assembly 200 may comprise a second heat dissipation device 202. Second heat dissipation device 202 may comprise a heat sink, such as a finned heat sink, and may have a fan (not shown) coupled thereto, although, of course, this is just one configuration, and claimed subject matter is not limited in this respect. Additionally, second heat dissipation device 202 may be coupled to one or more of the aforementioned microelectronic components 102 and/or substrate 106 by use of one or more adhesive materials, and/or one or more mechanical fastener mechanisms such as clamps and/or pins (not shown), for example. It is important to note, however, that numerous configurations of a heat dissipation device as well as numerous methods of attachment exist, and claimed subject matter is not limited in this respect.

For example, second heat dissipation device 202 may be coupled to the second surface 124 of substrate 106. In the case that substrate 106 is thin, such as for mylar tape, substrate 106 itself may be clamped into second heat dissipation device 202. In such a case, inside clamping surfaces (not shown) of second heat dissipation device 202 may be appropriately contoured. In such a case, multiple microelectronic components 202 may be clamped with a single pair of heat sinks 126 and 202. Additionally or alternatively, second heat dissipation device 202 may be coupled to microelectronic component 102 through aperture 122. For example, heat dissipation device 126 may be coupled to the second surface 124 of substrate 106 and/or to microelectronic component 102 by use of one or more adhesive materials, and/or one or more mechanical fastener mechanisms such as clamps and/or pins (not shown), for example. Additionally or alternatively, second heat dissipation device 202 may be electrically connected to the electronics implemented on integrated circuit 108 so that second heat dissipation device 202 presents a capacitive advantage, such as for the power supply grid on the top metal layer, for example. It is important to note, however, that numerous configurations of a heat dissipation device as well as numerous methods of attachment exist, and claimed subject matter is not limited in this respect. Substrate 106 with coupled heat dissipation devices 126 and 202 may be mounted vertically within an enclosure (not shown) or may be mounted in a raised manner within an enclosure.

Second heat dissipation device 202 may comprise a main body 204 and a pin 206 extending from main body 204. Pin 206 of the second heat dissipation device 202 may extend through aperture 122 of substrate 106. Pin 206 of the second heat dissipation device 202 may be coupled to front surface 114 of microelectronic component 102. For example, pin 206 of the second heat dissipation device 202 may be coupled to integrated circuit 108 (shown in FIG. 1), a cap (not shown) optionally placed over integrated circuit 108, and/or may be coupled to other portions of the front surface 114 of microelectronic component 102. Pin 206 may be oriented and arranged to align with the package 112 upon insertion through aperture 122 of substrate 106 in such a manner that the bonding pads (not shown) will not be damaged when second heat dissipation device 202 is carefully attached. Pin 206 may be made of and/or filled with a heat conducting material to facilitate heat transfer. Further, various depths for pin 206 may be used depending on the thickness of the substrate.

A thermally conductive material 208 may be located between second heat dissipation device 202 and the front surface 114 of the microelectronic component 102. Thermally conductive material 208 may comprise a chemical bonding compound used to directly attach second heat dissipation device 202 to integrated circuit 108. Occasionally, integrated circuits 108 may have a nitride layer on top that protects integrated circuit 108. In such an arrangement, second heat dissipation device 202 may be bonded directly to the nitride layer on top of integrated circuit 108.

Additionally or alternatively, substrate 106 may comprise two or more apertures 122. In such an arrangement, two or more second heat dissipation devices 202 may be associated with the corresponding two or more apertures 122. Additionally or alternatively, in such an arrangement, one or more of the second heat dissipation devices 202 may comprise two or more pins 206 that may be associated with the corresponding two or more apertures 122. Accordingly, one or more second heat dissipation devices 202 may be coupled to front surfaces 114 of two or more microelectronic components 102.

In operation, although claimed subject matter is not so limited, heat may be conducted from one or more microelectronic components 102 to the heat dissipation device 126 as well as to the second heat dissipation device 202, for example. For example, heat generated by microelectronic components 102 may be at least partially transferred by conduction to heat dissipation device 126 as well as to the second heat dissipation device 202. Further, heat may be transferred from the heat dissipation device 126 as well as from second heat dissipation device 202 to the surrounding air by convection, which may be assisted by use of a fan, for example. There are now two radiating surfaces for substrate 106, so the velocity of air flow necessary to reduce $T_{open}$ may drop significantly. Alternatively, the same velocity of air flow, duplicated on each side of substrate 106, may move much more heat. Accordingly, a pair of heat dissipation devices 126 and 202 may be bonded to both sides of the microelectronic components 102, thus doubling heat conduction in a single step. This may facilitate higher temperature density tolerances for the microelectronic components 102. Further, second heat dissipation device 202 may have the potential to have a better heat transfer coefficient to the integrated circuit 108 than heat dissipation device 126 because there may not be packaging material between second heat dissipation device 202 and integrated circuit 108.

Additionally, second heat dissipation device 202 may take the place of a cap to cover a bare integrated circuit 108. For example this second heat dissipation device 202 may be installed by the system's manufacturer. The supplier of integrated circuit 108 may provide package 112 without the cap (not shown), or the system manufacturer may remove the cap, and then integrated circuit 108 may be bond to second heat dissipation device 202 by the system's manufacturer after microelectronic components 102 is placed on substrate 106.

Figure 3:
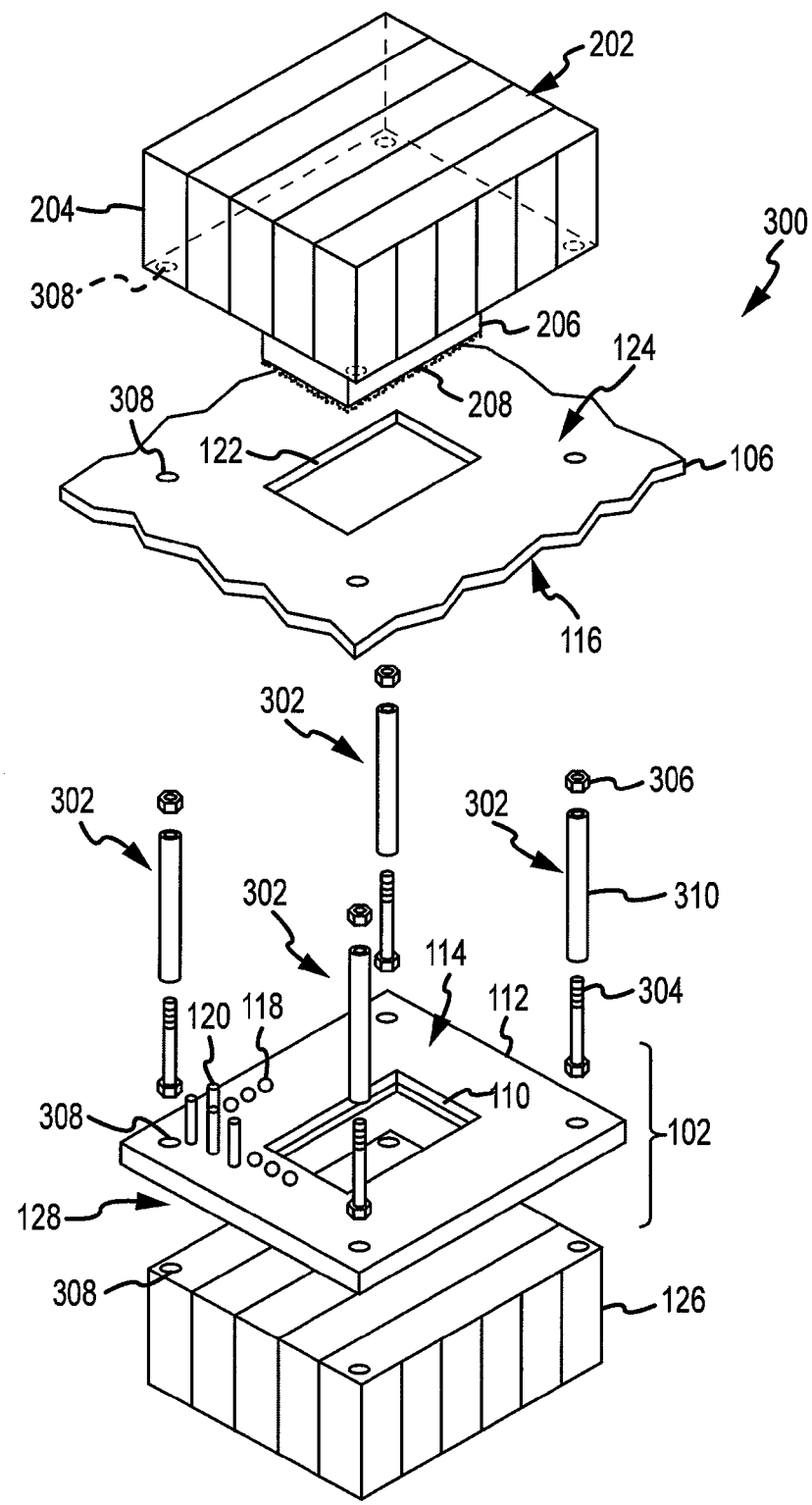
FIG. 3 is an exploded perspective view illustrating an electronic assembly in accordance with one or more embodiments.

Referring now to FIG. 3, there is illustrated an exploded perspective view of an electronic assembly, in accordance with at least one embodiment. An electronic assembly 300 may comprise one or more fasteners 302 capable of engaging heat dissipation device 126 and engaging second heat dissipation device 202. For example, the one or more fasteners 302 may comprise pairs of bolts 304 and nuts 306. In such an arrangement, microelectronic components 102, substrate 106, heat dissipation device 126, and/or second heat dissipation device 202 may comprise holes 308 capable of receiving at least a portion of fasteners 302. For example, some packages 112 may have additional bolt holes and/or bolt extensions on them for facilitating the attachment of second heat dissipation device 202. In such an arrangement, holes 308 may extend through the substrate 106 and package 112. Then holes 308 may exist in second heat dissipation device 202, and heat dissipation device 126 may be tapped, or have space for nuts 306. Then bolts 304 may extend through from second heat dissipation device 202 to heat dissipation device 126, thus leaving the integrated circuit 108 clamped in the middle between the two heat dissipation device 126 and 202. The torque on the bolts 304 may determine the mechanical pressure that is exerted upon integrated circuit 108 which is clamped in the middle. The larger the clamping pressure, the better the heat transfer; however, at some point integrated circuit 108 may break.

Additionally or alternatively, in such an arrangement, electronic assembly 300 may comprise one or more sleeves 310 operatively associated with the one or more fasteners 302. The one or more sleeves 310 may be capable of maintaining a gap between second heat dissipation device 202 and the microelectronic component 102. Additionally or alternatively, the one or more sleeves 310 may be capable of preventing over tightening of fasteners 302 by maintaining a gap between second heat dissipation device 202 and the microelectronic component 102.

In operation, as discussed above, when a clamping method is used, integrated circuit 108 may crack due to uneven pressure between the two heat dissipation device 126 and 202. One method for overcoming this may be to use sleeves 310 on bolts 302 between the pair of heat dissipation devices 126 and 202. For example, sleeves 310 may be sized to a length such that when bolts 302 are snug, a small gap may exist between integrated circuit 108 and second heat dissipation device 202, this gap may be filled with thermally conductive material 208, such as silicon grease for example. Additionally or alternatively, the diameter of sleeves 310 may be chosen so that sleeves 310 act as very stiff springs. In such an arrangement, sleeves 310 may be sized to such a length that bolt torque may transfer most of the force into sleeves 310, and little force may be transferred to integrated circuit 108. Each bolt 304 may then be torqued down in succession or simultaneously so that only small changes in uneven pressure occur at each tightening step. Additionally or alternatively, sleeves 310 may be employed along with a jig (not shown) for tightening bolts 304 at the same time, such that the torque on each bolt 304, to a high degree of precision, may be the substantially the same at every moment. In this manner, the gap between second heat dissipation device 202 and integrated circuit 108 may be very carefully narrowed or eliminated.

Figure 4:
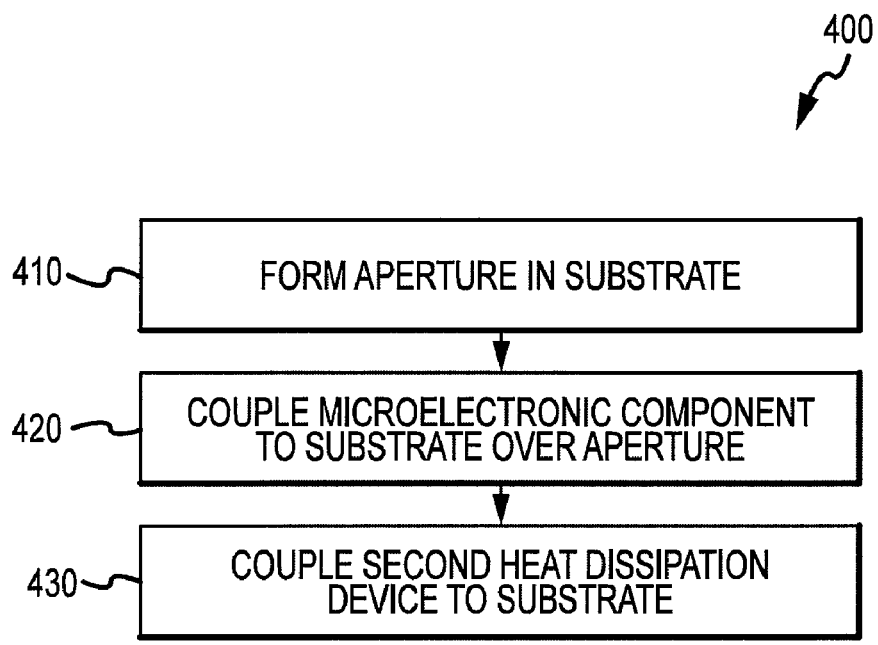
FIG. 4 is a flow diagram illustrating an example procedure in accordance with one or more embodiments.

Referring to FIG. 4, a flow diagram illustrates an example procedure of making one or more of the aforementioned devices and/or assemblies, although the scope of claimed subject matter may not be limited in this respect. Procedure 400 is illustrated in FIG. 4 with a number of blocks that may be used to manufacture one or more of the aforementioned devices and/or assemblies. Additionally, although procedure embodiment 400, as shown in FIG. 4, comprises one particular order of blocks, the order in which the blocks are presented does not necessarily limit claimed subject matter to any particular order. Likewise, intervening blocks shown in FIG. 4 and/or additional blocks not shown in FIG. 4 may be employed and/or blocks shown in FIG. 4 may be eliminated, without departing from the scope of claimed subject matter.

As illustrated, procedure embodiment 400 starts at block 410 where aperture 122 may be formed in substrate 106. At block 420, microelectronic component 102, with or without heat dissipation device 126, may be coupled to substrate 106 over aperture 122. At block 430, second heat dissipation device 202 may be coupled to substrate 106.

Figure 6:
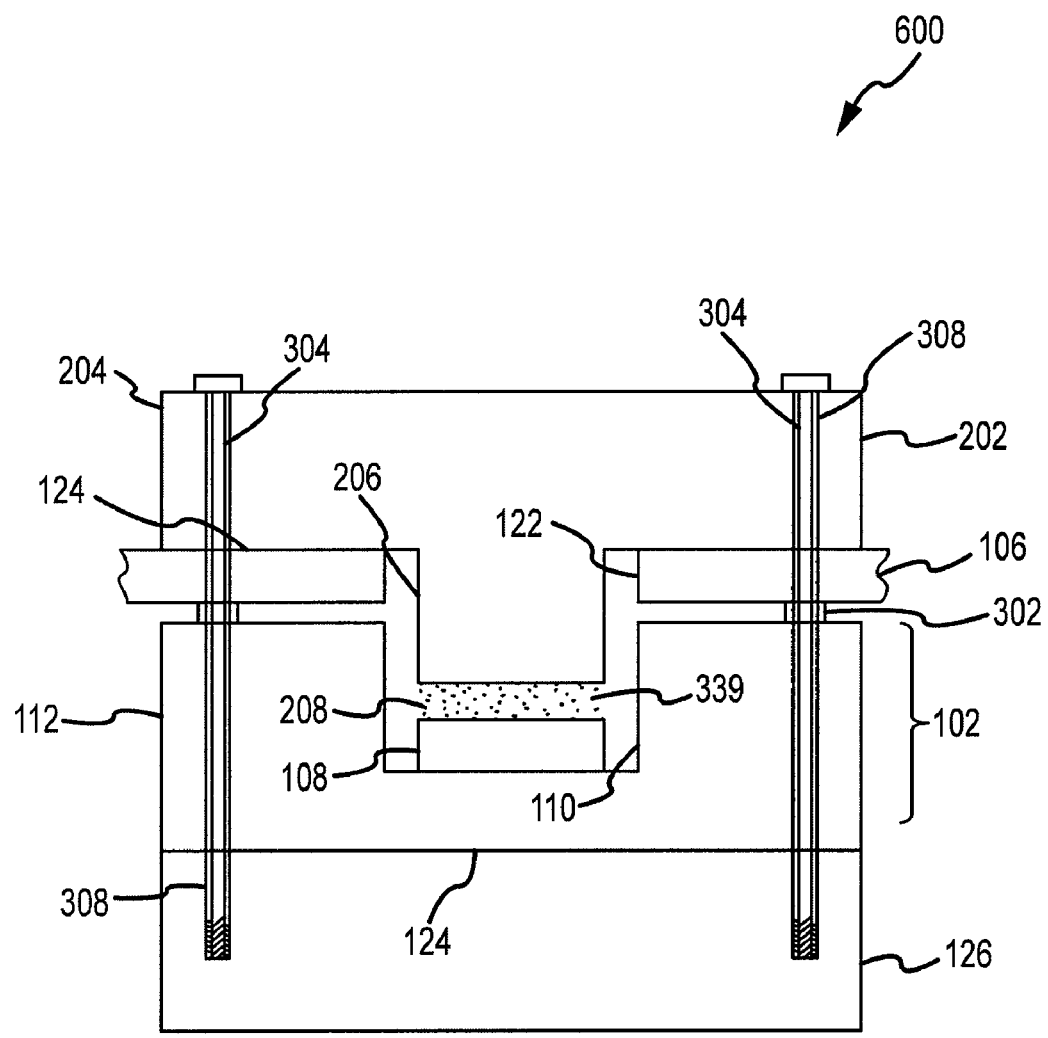
FIG. 6 is a cross sectional view illustrating an electronic assembly in accordance with one or more embodiments.

FIG. 6 is a cross sectional view illustrating an electronic assembly 600 in accordance with one or more embodiments. The electronic assembly 201 may comprise one or more microelectronic components 102 coupled to a substrate 106 having an aperture 122 that passes from a first surface 116 to a second surface 124 of the substrate. The microelectronic component 102 may comprise an integrated circuit 108 located within a hollow 110 of a package 112. A heat dissipation device 126 may be coupled to a back surface 128 of one or more microelectronic components 102. A second heat dissipation device 202 may be coupled to a second surface 124 of the substrate 106. The second heat dissipation device 202 may comprise a main body 204 and a pin 206 extending from the main body 204. The pin 206 may extend through the aperture 122 of the substrate 106. The pin 206 may be coupled to the integrated circuit 108. A thermally conductive material 208 may be located between the second heat dissipation device 202 and the integrated circuit 108. The pin 206 may extend through the hollow of the package. Bolts 304 may extend through heat dissipation device 126, substrate 106, package 112, and second heat dissipation device 202. Sleeves 310 may be associated with fasteners 302 capable of maintaining a gap 339 between the second heat dissipation device 202 and the microelectronic component 102. The gap 339 may exist between the integrated circuit 108 and the second heat dissipation device 202. The gap 339 may be filled with thermally conductive material 208.

Figure 7:
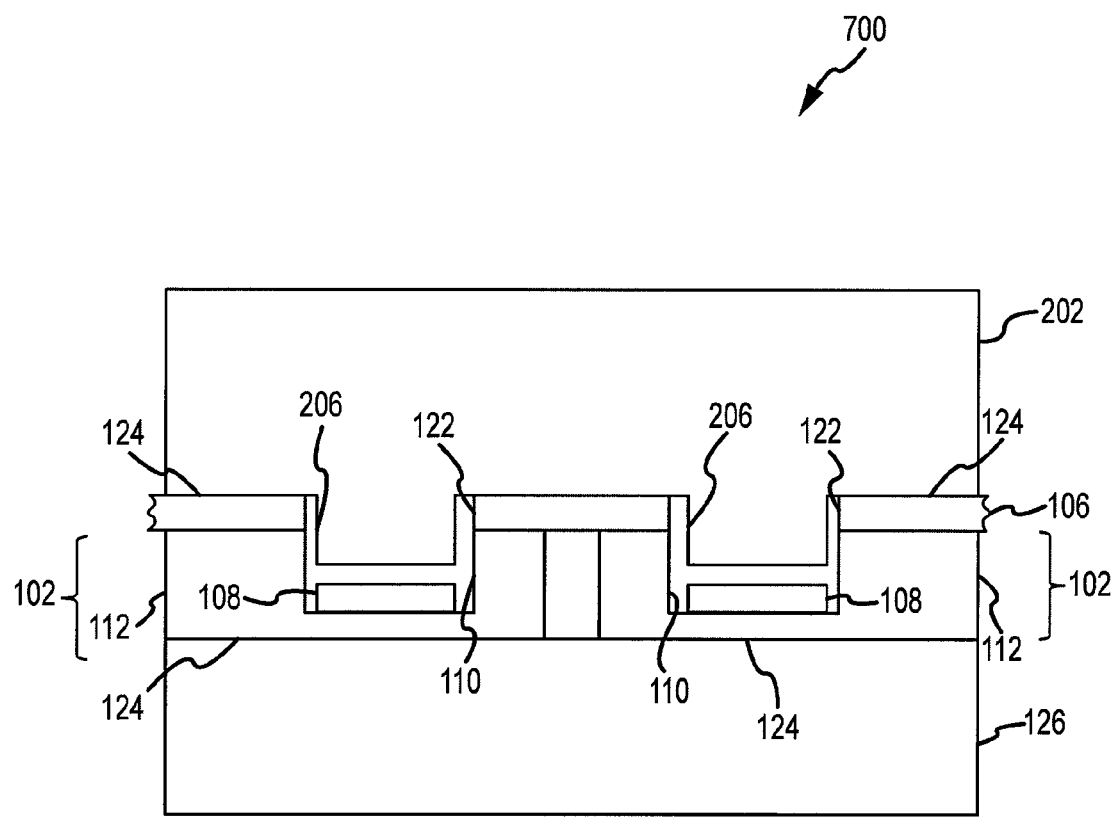
FIG. 7 is a cross sectional view illustrating an electronic assembly in accordance with one or more embodiments.

FIG. 7 is a cross sectional view illustrating an electronic assembly 700 in accordance with one or more embodiments. The electronic assembly 700 may comprise a substrate 106 having two apertures 122. A heat dissipation device 126 may be coupled to a back surface 124 of two or more microelectronic components 102. A second heat dissipation device 202 may comprise two or more pins 206 that may be associated with the corresponding two or more apertures 122. Each microelectronic component 102 may comprise an integrated circuit in a hollow 110 of a package 112.

Figure 5:
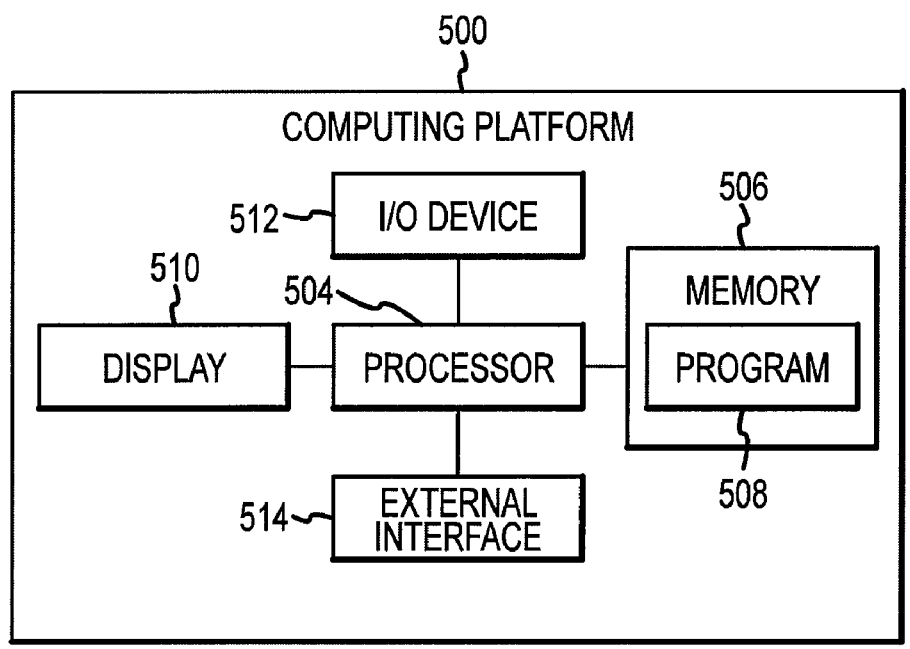
FIG. 5 is a schematic diagram of an example computing platform in accordance with one or more embodiments.

Referring to FIG. 5, a block diagram of a computing platform 500 according to one or more embodiments is illustrated, although the scope of claimed subject matter is not limited in this respect. Computing platform 500 may include more and/or fewer components than those shown in FIG. 5. However, generally conventional components may not be shown, for example, a battery, a bus, and so on.

Computing platform 500, as shown in FIG. 5 may be utilized to embody tangibly a computer program and/or graphical user interface by providing hardware components on which the computer program and/or graphical user interface may be executed. In such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 5, computing platform 500 may be controlled by processor 504, including one or more auxiliary processors (not shown). Processor 504 may comprise a central processing unit such as a microprocessor or microcontroller for executing programs, performing data manipulations, and controlling the tasks of computing platform 500. Auxiliary processors may manage input/output, perform floating point mathematical operations, manage digital signals, perform fast execution of signal processing algorithms, operate as a back-end processor and/or a slave-type processor subordinate to processor 504, operate as an additional microprocessor and/or controller for dual and/or multiple processor systems, and/or operate as a coprocessor and/or additional processor. Such auxiliary processors may be discrete processors and/or may be arranged in the same package as processor 504, for example, in a multicore and/or multithreaded processor; however, the scope of the scope of claimed subject matter is not limited in these respects.

Communication with processor 504 may be implemented via a bus (not shown) for transferring information among the components of computing platform 500. A bus may include a data channel for facilitating information transfer between storage and other peripheral components of computing platform 500. A bus further may provide a set of signals utilized for communication with processor 504, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of claimed subject matter is not limited in this respect.

Other components of computing platform 500 may include, for example, memory 506, including one or more auxiliary memories (not shown). Memory 506 may provide storage of instructions and data for one or more programs 508 to be executed by processor 504. Memory 506 may comprise, for example, semiconductor-based memory such as dynamic random access memory (DRAM) and/or static random access memory (SRAM), and/or the like. Other semiconductor-based memory types may include, for example, synchronous dynamic random access memory (SDRAM), Rambus dynamic random access memory (RDRAM), ferroelectric random access memory (FRAM), and so on. Alternatively or additionally, memory 506 may comprise, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 506 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 500 further may include a display 510. Display 510 may comprise a video display adapter having components, including, for example, video memory, a buffer, and/or a graphics engine. Such video memory may comprise, for example, video random access memory (VRAM), synchronous graphics random access memory (SGRAM), windows random access memory (WRAM), and/or the like. Display 510 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth.

Computing platform 500 further may include one or more I/O devices 512. I/O device 512 may comprise one or more I/O devices 512 such as a keyboard, mouse, trackball, touchpad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 500 further may include an external interface 514. External interface 514 may comprise one or more controllers and/or adapters to provide interface functions between multiple I/O devices 512. For example, external interface 514 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 512. External interface 514 for an embodiment may comprise a network controller capable of providing an interface, directly or indirectly, to a network, such as, for example, the Internet.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

What is claimed is:

1. An apparatus comprising:
   a substrate including a first surface, a second surface, and an aperture passing from the first surface to the second surface;
   a microelectronic component comprising an integrated circuit located within a hollow of a package, the microelectronic component including a back surface and a front surface, the front surface of the microelectronic component coupled to the first surface of the substrate to arrange at least a portion of the hollow of the package adjacent to the aperture of the substrate;
   a heat dissipation device coupled to the back surface of the microelectronic component; and
   a second heat dissipation device comprising a main body and a protrusion extending from the main body, the second heat dissipation device coupled to the second surface of the substrate, wherein the protrusion of the second heat dissipation device extends through the aperture of the substrate into the hollow of the package.

2. The apparatus of claim 1, wherein the heat dissipation device is coupled to back surfaces of two or more microelectronic components, wherein the substrate includes two or more apertures passing from the first surface of the substrate to the second surface of the substrate, wherein the second heat dissipation device includes two or more protrusions extending from the main body, and wherein each protrusion extends through a respective aperture of the substrate.

3. The apparatus of claim 1, further comprising:
   wherein the substrate includes two or more apertures passing from the first surface of the substrate to the second surface of the substrate;
   wherein the heat dissipation device is coupled to back surfaces of two or more microelectronic components; and
   wherein the second heat dissipation device is coupled to front surfaces of two or more microelectronic components.

4. The apparatus of claim 1, further comprising:
   one or more fasteners capable of engaging the heat dissipation device and engaging the second heat dissipation device; and
   one or more sleeves operatively associated with the one or more fasteners, wherein the one or more sleeves are capable of maintaining a gap between the second heat dissipation device and the microelectronic component.

5. The apparatus of claim 1, further comprising a thermally conductive material located between the heat dissipation device and the back surface of the microelectronic component.

6. The apparatus of claim 1, further comprising:
   a thermally conductive material located between the second heat dissipation device and the front surface of the microelectronic component.

7. The apparatus of claim 2, wherein each of the two or more microelectronic components include an integrated circuit located in a hollow of a package, wherein the two or more protrusions extending from the main body of the second heat dissipation device extend into the hollow of a respective package and positioned adjacent a respective integrated circuit.

8. A system comprising:
   a substrate having a first surface, a second surface, and an aperture passing from the first surface to the second surface;
   a microelectronic component having a back surface and a front surface, the front surface of the microelectronic component having an opening with an integrated circuit therein, the front surface of the microelectronic component coupled to the first surface of the substrate so that at least a portion of the integrated circuit is aligned with the aperture of the substrate;
   a first heat dissipation device coupled to the back surface of the microelectronic component; and
   a second heat dissipation device coupled to a second surface of the substrate so that at least a portion of the second heat dissipation device covers the aperture of the substrate, wherein the second heat dissipation device comprises a main body and a protrusion extending from the main body through the aperture of the substrate and into the hollow of the package.

9. The system of claim 8, further comprising:
   one or more fasteners capable of engaging the heat dissipation device and engaging the second heat dissipation device; and
   one or more sleeves operatively associated with the one or more fasteners, wherein the one or more sleeves are capable of maintaining a gap between the second heat dissipation device and the microelectronic component.

10. The system of claim 8, further comprising:
    a thermally conductive material located between the second heat dissipation device and a surface of the integrated circuit.

11. The system of claim 8 wherein the protrusion of the second heat dissipation device is bonded to a top surface of the integrated circuit or a cover thereon.

12. A method of removing heat from a microelectronic component comprising an integrated circuit located in a hollow of a package, the microelectronic component having a front surface mounted on a first surface of a substrate, comprising:
    removing heat from a first surface of the microelectronic component; and
    removing heat from a second surface of the microelectronic component by providing a portion of a first heat dissipation device through an aperture in the substrate and into the hollow of the package of the microelectronic component, wherein the aperture passes from the first surface of the substrate to a second surface of the substrate.

13. The method of claim 12, wherein removing heat from a first surface of the microelectronic component comprises coupling a second heat dissipation device to the first surface of the microelectronic component.

14. The method of claim 12, further comprising:
    engaging one or more fasteners to the first heat dissipation device and to the second heat dissipation device; and
    maintaining a gap between the second heat dissipation device and the microelectronic component at least via operatively associating one or more sleeves with the one or more fasteners.

15. The method of claim 12, further comprising:
    placing a thermally conductive material between a first heat dissipation device and the front surface of the microelectronic component; and
    coupling the first heat dissipation device to the second surface of the substrate.

* * * * *